US012733530B2

(12) United States Patent
Oda et al.

(10) Patent No.: US 12,733,530 B2
(45) Date of Patent: Sep. 8, 2026

(54) BONDING WIRE FOR SEMICONDUCTOR DEVICES

(71) Applicant: NIPPON MICROMETAL CORPORATION, Saitama (JP)

(72) Inventors: Daizo Oda, Saitama (JP); Motoki Eto, Saitama (JP); Takashi Yamada, Saitama (JP); Teruo Haibara, Saitama (JP); Ryo Oishi, Saitama (JP)

(73) Assignee: Nippon Micrometal Corporation, Saitama (JP)

( * ) Notice: Subject to any disclaimer, the term of this patent is extended or adjusted under 35 U.S.C. 154(b) by 357 days.

(21) Appl. No.: 18/572,753

(22) PCT Filed: Mar. 16, 2022

(86) PCT No.: PCT/JP2022/012062

§ 371 (c)(1),
(2) Date: Dec. 20, 2023

(87) PCT Pub. No.: WO2022/270051

PCT Pub. Date: Dec. 29, 2022

(65) Prior Publication Data

US 2024/0297142 A1 Sep. 5, 2024

(30) Foreign Application Priority Data

Jun. 25, 2021 (JP) ................................ 2021-105513

(51) Int. Cl.
*H10W 72/50* (2026.01)
*H10W 72/00* (2026.01)
(Continued)

(52) U.S. Cl.
CPC ......... *H10W 72/50* (2026.01); *H10W 72/015* (2026.01); *H10W 72/075* (2026.01);
(Continued)

(58) Field of Classification Search
CPC ............. G01N 23/203; G01N 23/2276; G01N 2223/102; G01N 2223/601;
(Continued)

(56) References Cited

U.S. PATENT DOCUMENTS 9,773,748 B2 9/2017 Yamada et al.
10,468,370 B2 11/2019 Yamada et al.
(Continued)

FOREIGN PATENT DOCUMENTS

CN 106475701 A 3/2017
EP 2239766 A1 10/2010
(Continued)

OTHER PUBLICATIONS

Office Action dated May 16, 2025, from corresponding Taiwanese Patent Application No. 111114950, 7 pages.
(Continued)

*Primary Examiner* — Hoai V Pham
(74) *Attorney, Agent, or Firm* — RIMON P.C.

(57) ABSTRACT

To provide a novel Cu bonding wire that achieves a favorable FAB shape and a favorable bondability of the 2nd bonded part, and further achieves favorable bond reliability even in a rigorous high-temperature environment. The bonding wire for semiconductor devices includes: a core material of Cu or Cu alloy; and a coating layer containing conductive metal other than Cu formed on a surface of the core material, wherein the coating layer has a region containing Ni as a main component on a core material side, and has a region containing Au and Ni on a wire surface side, in a thickness direction of the coating layer, a thickness of the coating layer is 10 nm or more and 130 nm or less, a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less, a concentration of Au at the surface of the wire
(Continued)

is 10 atomic % or more and 90 atomic % or less, and at least one of the following conditions (i) and (ii) is satisfied:
(i) a concentration of In relative to the entire wire is 1 ppm by mass or more and 100 ppm by mass or less
(ii) a concentration of Ag relative to the entire wire is 1 ppm by mass or more and 500 ppm by mass or less.

13 Claims, 2 Drawing Sheets

(51) Int. Cl.
*G01N 23/203* (2006.01)
*G01N 23/2276* (2018.01)
*H10W 95/00* (2026.01)

(52) U.S. Cl.
CPC ....... *G01N 23/203* (2013.01); *G01N 23/2276* (2013.01); *G01N 2223/102* (2013.01); *G01N 2223/601* (2013.01); *G01N 2223/602* (2013.01); *G01N 2223/61* (2013.01); *G01N 2223/611* (2013.01); *G01N 2223/633* (2013.01); *H10W 72/01515* (2026.01); *H10W 72/01551* (2026.01); *H10W 72/01565* (2026.01); *H10W 72/07511* (2026.01); *H10W 72/07532* (2026.01); *H10W 72/07533* (2026.01); *H10W 72/522* (2026.01); *H10W 72/523* (2026.01); *H10W 72/535* (2026.01); *H10W 72/552* (2026.01); *H10W 72/5522* (2026.01); *H10W 72/5525* (2026.01); *H10W 72/555* (2026.01); *H10W 95/00* (2026.01)

(58) Field of Classification Search
CPC ......... G01N 2223/61; G01N 2223/633; B23K 35/0227; B23K 35/302; C22C 9/00; C22C 9/06; H10W 72/015; H10W 72/01515; H10W 72/01551; H10W 72/01565; H10W 72/075; H10W 72/07511; H10W 72/07532; H10W 72/07533; H10W 72/50; H10W 72/522; H10W 72/523; H10W 72/535; H10W 72/552; H10W 72/5522; H10W 72/5525; H10W 72/555
See application file for complete search history.

(56) References Cited

U.S. PATENT DOCUMENTS

2006/0186544 A1 8/2006 Won et al.
2007/0235887 A1 10/2007 Kaimori et al.
2009/0188696 A1 7/2009 Uno et al.
2010/0282495 A1 11/2010 Uno et al.
2016/0111389 A1* 4/2016 Yamada .................... C22C 5/06 174/126.1
2016/0315063 A1 10/2016 Uno et al.
2017/0040281 A1 2/2017 Oyamada et al.
2017/0125135 A1 5/2017 Amano et al.
2017/0200689 A1 7/2017 Yamada et al.
2017/0216974 A1 8/2017 Yamada et al.
2018/0130763 A1 5/2018 Yamada et al.
2018/0133843 A1 5/2018 Yamada et al.
2020/0013748 A1 1/2020 Yamada et al.
2020/0168578 A1 5/2020 Oyamada et al.
2020/0279824 A1 9/2020 Oyamada et al.
2020/0312808 A1 10/2020 Oda et al.
2022/0005781 A1* 1/2022 Amano ............... H10W 70/457
2022/0122937 A1 4/2022 Takada et al.
2023/0018430 A1 1/2023 Oda et al.
2023/0148306 A1 5/2023 Eto et al.

FOREIGN PATENT DOCUMENTS

JP S61-048543 A 3/1986
JP 2005-167020 A 6/2005
JP 2006-190763 A 7/2006
JP 2015-119004 A 6/2015
JP 2017-92078 A 5/2017
JP 2018-503743 A 2/2018
KR 100702662 B1 4/2007
KR 2010-0023893 A 3/2010
KR 2010-0032451 A 3/2010
KR 2017-0029013 A 3/2017
TW 201920701 A 6/2019
TW 201921531 A 6/2019
TW 201921535 A 6/2019
WO 2015/163297 A1 10/2015
WO 2016/204138 A1 12/2016
WO 2017/013796 A1 1/2017
WO 2017/221770 A1 12/2017
WO 2019/031498 A1 2/2019
WO 2020/183748 A1 9/2020
WO 2020/246094 A1 12/2020
WO 2021/193378 A1 9/2021

OTHER PUBLICATIONS

International Search Report received in International Application No. PCT/JP2022/012012, dated May 31, 2022.
Office Action dated Sep. 26, 2025, issued in corresponding Korean Patent Application No. 10-2023-7043819.
Office Action dated May 21, 2025, from corresponding Taiwanese Patent Application No. 111111833, 11 pages.
Extended European Search Report issued in the corresponding European Patent Application No. 22827971.7 on Jul. 11, 2025.
Extended European Search Report issued in the corresponding European Patent Application No. 22827995.6 on Jul. 11, 2025.
Office Action issued in related U.S. Appl. No. 18/572,708, mailed Mar. 9, 2026.

* cited by examiner

BONDING WIRE FOR SEMICONDUCTOR DEVICES

CROSS-REFERENCE TO RELATED APPLICATIONS

This application is the U.S. National Phase under 35 U.S.C. § 371 of International Application No. PCT/JP2022/012062, filed on Mar. 16, 2023, which claims the benefit of foreign priority to Japanese Patent Application No. 2021-105513 filed on Jun. 25, 2023, the entire contents of each of which are hereby incorporated by reference.

TECHNICAL FIELD

The present invention relates to a bonding wire for semiconductor devices. Furthermore, the present invention relates to a semiconductor device including the bonding wire.

BACKGROUND ART

In semiconductor devices, electrodes formed on a semiconductor chip are connected with a lead frame or electrodes on a substrate using a bonding wire. A bonding method for bonding wires is typically a thermocompression bonding method using ultrasonic waves, and a general-purpose bonding device, a capillary jig used for bonding by inserting a bonding wire therethrough, and the like are used. A bonding process is carried out by performing 1st bonding of a wire part onto an electrode on the semiconductor chip; forming a loop; and finally performing 2nd bonding of a wire part onto the lead frame or an external electrode on the substrate. In the 1st bonding, a tip end of wire is heated and melted by arc heat input to form a free air ball (FAB: Free Air Ball; hereinafter also simply referred to as "ball" or "FAB") through surface tension, and then this ball part is compression-bonded (hereinafter referred to as "ball-bonded") onto the electrode on the semiconductor chip. In the 2nd bonding, the wire part is compression-bonded (hereinafter referred to as "wedge-bonded") onto the external electrode by applying ultrasonic waves and load to the wire part without forming the ball.

Gold (Au) has been the common material of the bonding wire, but has been being replaced with copper (Cu) mainly for LSI use (e.g., Patent Literatures 1 to 3) Meanwhile, for on-vehicle device use on the background of recent proliferation of electric vehicles and hybrid vehicles, and further for power device (power semiconductor device) use in large power equipment such as air conditioners and photovoltaic power generation systems, there has been a growing demand for replacement with Cu that has high efficiency and reliability due to its high thermal conductivity and fusing current characteristic.

Cu has the drawback of being more susceptible to oxidation than Au. As a method of preventing the surface oxidation of the Cu bonding wire, there has been proposed a structure in which a surface of a Cu core material is coated with a metal such as Pd and Ni (Patent Literature 4). There has been also proposed a Pd-coated Cu bonding wire which has an improved bond reliability of the 1st bonded part by coating a surface of a Cu core material with Pd and adding Pd and Pt into the Cu core material (Patent Literature 5).

RELATED ART REFERENCE

Patent Literature

Patent Literature 1: JP-A-S61-48543

Patent Literature 2: JP-T-2018-503743

Patent Literature 3: WO 2017/221770

Patent Literature 4: JP-A-2005-167020

Patent Literature 5: WO 2017/013796

SUMMARY OF INVENTION

Problem to be Solved by the Invention

The on-vehicle devices and the power devices tend to be exposed to higher temperature as compared with general electronic devices during operation, and the bonding wire used therefor is required to exhibit a favorable bond reliability in a rigorous high-temperature environment.

The present inventors have conducted the evaluation based on the characteristics required for the on-vehicle devices and the like and found that, in some cases, the conventional Cu bonding wires with the Pd-coating layers cause a galvanic corrosion in a high-temperature environment and fail to sufficiently achieve the bond reliability of the 2nd bonded parts. On the other hand, the bare Cu bonding wire without the Pd-coating layer does not cause galvanic corrosion, but provides a poor FAB shape and consequently an inferior compression-bonding shape of the 1st bonded part and thus cannot be sufficiently applied for a fine-pitch bonding required for high-density mounting. Furthermore, bond reliability of the 1st bonded part cannot be sufficiently obtained in a high-temperature environment in some cases.

As a result of investigating a Cu-based bonding wire that achieves a favorable FAB shape and has bond reliability that is less deteriorated even under a rigorous high-temperature environment required for on-vehicle devices and the like, it has been found that an Ni-coated Cu bonding wire obtained by coating the surface of the Cu core material with Ni exhibits a certain degree of favorable result in terms of the FAB shape and the bond reliability in a high-temperature environment. However, as for the Ni-coated Cu bonding wire, bondability of the 2nd bonded part (bondability of the 2nd bonded part immediately after bonding) cannot be sufficiently obtained in some cases.

As described above, it is desirable to develop a Cu-based bonding wire that achieves a favorable FAB shape and favorable bondability of the 2nd bonded part, and further achieves favorable bond reliability in a high-temperature environment. In this regard, the characteristics required for on-vehicle devices and the like are more and more demanding, and it is desirable to guarantee operation at higher temperature. To evaluate the bond reliability of the bonding wire in the high-temperature environment, a High Temperature Storage Life Test (HTSL) is often conducted, in which a sample is exposed to an environment with a temperature of 175° C., assuming a rigorous high-temperature environment. However, the present inventors have conducted HTSL at a temperature of 200° C., assuming a more rigorous high-temperature environment. As a result, it has been found that even a bonding wire that achieves favorable bond reliability of both of the 1st bonded part and the 2nd bonded part at a temperature of 175° C. tends to lose its bond reliability, particularly of the 2nd bonded part at a temperature of 200° C. It has been also confirmed that this tendency becomes more pronounced as the wire diameter of the bonding wire becomes larger.

An object of the present invention is to provide a novel Cu bonding wire that achieves a favorable FAB shape and favorable bondability of the 2nd bonded part, and further achieves favorable bond reliability of both of the 1st bonded part and the 2nd bonded part even in a rigorous high-temperature environment.

Means for Solving Problem

As a result of earnest investigation as to the problem described above, the present inventors have found that the problem described above can be solved by the bonding wire having the configuration described below, and completed the present invention.

That is, the present invention includes the following content.

[1] A bonding wire for semiconductor devices, the bonding wire comprising:
a core material of Cu or Cu alloy; and
a coating layer containing conductive metal other than Cu formed on a surface of the core material, wherein
the coating layer has a region containing Ni as a main component on a core material side, and has a region containing Au and Ni on a wire surface side, in a thickness direction of the coating layer,
a thickness of the coating layer is 10 nm or more and 130 nm or less,
a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less,
a concentration of Au at the surface of the wire is 10 atomic % or more and 90 atomic % or less, and
at least one of the following conditions (i) and (ii) is satisfied:
(i) a concentration of In relative to the entire wire is 1 ppm by mass or more and 100 ppm by mass or less
(ii) a concentration of Ag relative to the entire wire is 1 ppm by mass or more and 500 ppm by mass or less.

[2] The bonding wire according to [1], wherein the concentration of Au at the surface of the wire is measured using Auger electron spectroscopy (AES) under the following <Condition>:
<Condition> a center of width of a measuring surface is aligned with a center of width of the wire, the width of the measuring surface is 5% or more and 15% or less of a diameter of the wire, and a length of the measuring surface is five times the width of the measuring surface.

[3] The bonding wire according to [1] or [2], wherein the coating layer further contains Pd as conductive metal other than Cu.

[4] The bonding wire according to any one of [1] to [3], wherein a ratio $C_{Ni}/C_{M}$ of a concentration $C_{Ni}$ (mass %) of Ni to a total concentration $C_{M}$(mass %) of Ni, Au, and Pd relative to the entire wire is 0.5 or more.

[5] The bonding wire according to any one of [1] to [4], wherein a maximum concentration of Ni is 80 atomic % or more in a concentration profile in a depth direction of the wire.

[6] The bonding wire according to [5], wherein the concentration profile in the depth direction of the wire is obtained by performing the measurement using Auger electron spectroscopy (AES) under the following <Condition> while digging down the wire from its surface in the depth direction by Ar sputtering:
<Condition> a center of width of a measuring surface is aligned with a center of width of the wire, the width of the measuring surface is 5% or more and 15% or less of a diameter of the wire, and a length of the measuring surface is five times the width of the measuring surface.

[7] The bonding wire according to any one of [1] to [6], wherein when forming a free air ball (FAB: Free Air Ball) by using the wire and then measuring crystal orientations in a cross-section of the FAB perpendicular to a compression-bonding direction, a proportion of a crystal orientation <100> angled at 15° or less to the compression-bonding direction is 30% or more.

[8] The bonding wire according to [7], wherein the proportion of the crystal orientation <100> angled at 15° or less to the compression-bonding direction is 50% or more.

[9] The bonding wire according to any one of [1] to [8], wherein the thickness of the coating layer is 18 nm or more.

[10] The bonding wire according to any one of [1] to [9], wherein
the bonding wire contains one or more elements selected from the group consisting of B, P and Mg (hereinafter referred to as a "first additive element"), and
a total concentration of the first additive element is 1 ppm by mass or more and 100 ppm by mass or less relative to the entire wire.

[11] The bonding wire according to any one of [1] to [10], wherein
the bonding wire contains one or more elements selected from the group consisting of Se, Te, As and Sb (hereinafter referred to as a "second additive element"), and
a total concentration of the second additive element is 1 ppm by mass or more and 100 ppm by mass or less relative to the entire wire.

[12] The bonding wire according to any one of [1] to [11], wherein
the bonding wire contains one or more elements selected from the group consisting of Ga and Ge (hereinafter referred to as a "third additive element"), and
a total concentration of the third additive element is 0.011% by mass or more and 1.5% by mass or less relative to the entire wire.

[13] A semiconductor device comprising the bonding wire according to any one of [1] to [12].

Effect of the Invention

The present invention can provide a novel Cu bonding wire that achieves a favorable FAB shape and a favorable bondability of the 2nd bonded part, and further achieves favorable bond reliability of both of the 1st bonded part and the 2nd bonded part even in a rigorous high-temperature environment.

EMBODIMENT FOR CARRYING OUT THE INVENTION

Figure 1:
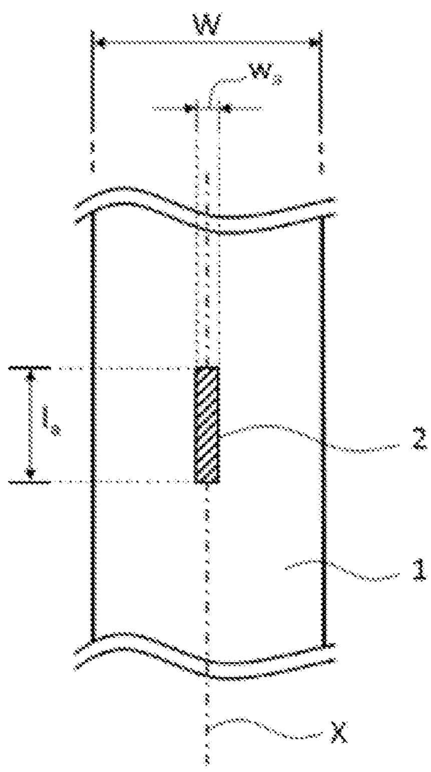
FIG. 1 is a schematic view illustrating a position and dimensions of a measuring surface for performing a composition analysis using AES.

Hereinafter, the present invention will be described in detail with reference to preferable embodiments thereof.

Drawings may be referred to during the explanation. However, note that each drawing schematically shows the shape, size and arrangement of constituent elements only to the extent that the invention can be understood. The present invention is not limited to the following embodiments and examples and may be modified for implementation within the scope not departing from the scope of claims of the present invention and their equivalents.

[Bonding Wire for Semiconductor Devices]

A bonding wire for semiconductor devices according to the present invention (hereinafter also simply referred to as a "wire of the present invention" or "wire") is characterized in that the bonding wire includes:

a core material of Cu or Cu alloy; and a coating layer containing conductive metal other than Cu formed on a surface of the core material, wherein the coating layer has a region containing Ni as a main component on a core material side, and has a region containing Au and Ni on a wire surface side, in a thickness direction of the coating layer, a thickness of the coating layer is 10 nm or more and 130 nm or less, a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less, a concentration of Au at a surface of the wire is 10 atomic % or more and 90 atomic % or less, and a concentration of at least one of In and Ag relative to the entire wire is 1 ppm by mass or more.

As described above, the bonding wires used for the on-vehicle devices and the power devices are required to exhibit a favorable bond reliability under a rigorous high-temperature environment. For example, the bonding wires used for the on-vehicle devices require the bond reliability in a high-temperature environment exceeding 150° C. The present inventors have conducted the evaluation based on the characteristics required for the on-vehicle devices and the like and found that, in some cases, the conventional Cu bonding wires with the Pd-coating layers cause a galvanic corrosion in a high-temperature environment and fail to sufficiently achieve the bond reliability of the 2nd bonded parts. Furthermore, the bare Cu bonding wire without the Pd-coating layer does not cause a galvanic corrosion, but provides a poor FAB shape and consequently an inferior compression-bonding shape of the 1st bonded part and thus cannot be sufficiently applied for a fine-pitch bonding required for high-density mounting. Furthermore, the bond reliability of the 1st bonded part cannot be sufficiently obtained in some cases in a high-temperature environment.

As a result of investigating a Cu-based bonding wire that achieves a favorable FAB shape and has bond reliability that is less deteriorated even under a rigorous high-temperature environment required for on-vehicle devices and the like, it has been found that an Ni-coated Cu bonding wire obtained by coating the surface of the Cu core material with Ni exhibits a certain degree of favorable result in terms of the FAB shape and the bond reliability in a high-temperature environment. However, as for the Ni-coated Cu bonding wire, bondability of the 2nd bonded part (bondability of the 2nd bonded part immediately after bonding) cannot be sufficiently obtained in some cases. Furthermore, when bonding is performed using the Ni-coated Cu bonding wire, wire shavings accumulate inside a capillary jig to cause clogging (hereinafter, this phenomenon is also referred to as "capillary clogging"), and continuous bonding is hindered in some cases.

The characteristics required for on-vehicle devices and power devices and the like are becoming more and more severe, and it is desirable to guarantee operation at higher temperature. To evaluate the bond reliability of the bonding wire in the high-temperature environment, HTSL is often conducted, in which a sample is exposed to an environment with a temperature of 175° C., assuming a rigorous high-temperature environment. However, the present inventors have conducted HTSL at a temperature of 200° C., assuming a more rigorous high-temperature environment. As a result, it has been found that even a bonding wire that achieves favorable bond reliability of both of the 1st bonded part and the 2nd bonded part at a temperature of 175° C. tends to lose its bond reliability, particularly of the 2nd bonded part at a temperature of 200° C. It was also confirmed that this tendency became more pronounced as the wire diameter of the bonding wire became larger.

In contrast, the present inventors have found that it is possible to achieve a favorable FAB shape and a favorable bondability of the 2nd bonded part, and further achieve favorable bond reliability of both of the 1st bonded part and the 2nd bonded part even in a rigorous high-temperature environment such as at a temperature 200° C., irrespective of the wire diameter, by using a bonding wire for semiconductor devices, which including:

a core material of Cu or Cu alloy; and a coating layer containing conductive metal other than Cu formed on a surface of the core material, wherein the coating layer has a region containing Ni as a main component on a core material side, and has a region containing Au and Ni on a wire surface side, in a thickness direction of the coating layer, a thickness of the coating layer is 10 nm or more and 130 nm or less, a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less, a concentration of Au at a surface of the wire is 10 atomic % or more and 90 atomic % or less, and a concentration of at least one of In and Ag relative to the entire wire is 1 ppm by mass or more. Additionally, by using this wire, capillary clogging can be suppressed during the continuous bonding, and productivity of semiconductor devices can be favorably maintained. In this way, the present invention greatly contributes to putting a Cu bonding wire into practical use and promotion in on-vehicle devices and the like.

<Core Material of Cu or Cu Alloy>

The wire of the present invention includes a core material of Cu or Cu alloy (hereinafter, also simply referred to as "Cu core material").

The Cu core material is not particularly limited as long as it is made of Cu or Cu alloy, and there may be used a known Cu core material constituting a conventional Pd-coated Cu wire which has been known as a bonding wire for semiconductor devices.

In the present invention, the concentration of Cu in the Cu core material may be, for example, 97 atomic % or more, 97.5 atomic % or more, 98 atomic % or more, 98.5 atomic % or more, 99 atomic % or more, 99.5 atomic % or more, 99.8 atomic % or more, 99.9 atomic % or more, 99.98 atomic % or more, or 99.99 atomic % or more in the center (axial core part) of the Cu core material.

From the viewpoint of improving the bond reliability in a high-temperature environment, particularly from the viewpoint of providing a bonding wire that achieves favorable bond reliability of 2nd bonded part in a rigorous high-temperature environment, irrespective of the wire diameter, the Cu core material preferably contains In, Ag so that the concentration of at least one of In and Ag relative to the entire wire is 1 ppm by mass or more. Preferable range of the concentration of In, Ag relative to the entire wire is described later.

The Cu core material may also contain one or more dopants selected from the first additive element, the second additive element and the third additive element described later, for example. Preferable contents of these dopants are described later.

In an embodiment, the Cu core material consists of Cu and inevitable impurities. In another embodiment, the Cu core material consists of Cu, at least one of In and Ag, and inevitable impurities. In still another embodiment, the Cu core material consists of Cu; one or more elements selected from the first additive element, the second additive element and the third additive element described later; and inevitable impurities. In still another embodiment, the Cu core material consists of Cu; at least one of In and Ag; one or more elements selected from the first additive element, the second additive element and the third additive element described later; and inevitable impurities. The term "inevitable impurities" used in relation to the Cu core material encompasses elements constituting the coating layer containing conductive metal other than Cu described later.

<Coating Layer Containing Conductive Metal Other than Cu>

The wire of the present invention includes a coating layer containing conductive metal other than Cu (hereinafter, also simply referred to as a "coating layer") formed on a surface of the Cu core material. Preferable composition of the coating layer will be described later. In the wire of the present invention, the coating layer preferably has a concentration of conductive metal other than Cu of 50 atomic % or more.

To achieve a favorable FAB shape and a favorable bondability of the 2nd bonded part, and further achieve favorable bond reliability in a high-temperature environment, it is important that the coating layer in the wire of the present invention satisfies all of the following conditions (1) to (4).

(1) The coating layer has a region containing Ni as a main component on the core material side, and has a region containing Au and Ni on the wire surface side, in a thickness direction of the coating layer.

(2) A thickness of the coating layer is 10 nm or more and 130 nm or less.

(3) The coating layer contains Au and Ni so that a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less.

(4) The coating layer contains Au so that concentration of Au at the surface of the wire is 10 atomic % or more and 90 atomic % or less.

—Condition (1)—

The condition (1) relates to the fact that the coating layer has the region containing Ni as a main component on the core material side, and has the region containing Au and Ni on the wire surface side, in the thickness direction of the coating layer.

By including the coating layer that satisfies the condition (1) in combination with the conditions (2) to (4), the wire of the present invention achieves a favorable FAB shape and favorable bond reliability in a high-temperature environment, and also exhibits excellent bondability of the 2nd bonded part. Additionally, by including the coating layer satisfying the condition (1), capillary clogging can be suppressed while the continuous bonding, and productivity of the semiconductor device can be favorably maintained.

In the condition (1), the coating layer has the region containing Ni as a main component on the core material side in the thickness direction of the coating layer. In the present invention, the "region containing Ni as a main component" used in relation to the coating layer means a region where the concentration of Ni is 50 atomic % or more. As described later, as the conductive metal other than Cu, the coating layer may contain Au on the wire surface side in addition to Ni, and further contain conductive metal such as Pd. From the viewpoint of achieving a favorable FAB shape and favorable bond reliability, particularly the bond reliability of the 1st bonded part in a high-temperature environment, it is preferable that the coating layer contains Ni so that a ratio $C_{Ni}/C_M$ of the concentration $C_{Ni}$ (mass %) of Ni to a total concentration $C_M$ (mass %) of Ni, Au, and Pd relative to the entire wire is preferably 0.5 or more, more preferably 0.6 or more, further preferably 0.7 or more, or 0.8 or more. An upper limit of the ratio $C_{Ni}/C_M$ described above is not particularly limited as long as the conditions (2) to (4) are satisfied, and may be 0.995 or less, or 0.99 or less and the like, for example. The ratio $C_{Ni}/C_M$ can be calculated by dividing the concentration $C_{Ni}$ (mass %) of Ni relative to the entire wire measured by a method described in [Measurement of element content] described later by the total concentration $C_M$ (mass %) of Ni, Au, and Pd that is similarly measured.

Regarding the condition (1), the fact that the coating layer has the region containing Ni as a main component on the core material side and has the region containing Au and Ni on the wire surface side, in the thickness direction of the coating layer can be confirmed by performing composition analysis using Auger electron spectroscopy (AES) while digging down the wire from its surface in the depth direction (direction to the center of the wire) by Ar sputtering. Specifically, a change in concentration of each element in the direction from the surface of the wire toward the depth (center) of the wire (so-called a concentration profile in the depth direction) is obtained by performing 1) a composition analysis of the wire surface, and then repeating 2) a sputtering process with Ar and 3) a surface composition analysis after the sputtering treatment, and the above factors can be confirmed from the concentration profile. In the present invention, for obtaining the concentration profile in the depth direction, the unit of depth was in terms of $SiO_2$.

When performing 1) the composition analysis of the wire surface and 3) the surface composition analysis after the sputtering treatment, a position and dimensions of a measuring surface are determined as follows. In the following description, the width of the measuring surface indicates the dimension of the measuring surface in a direction perpendicular to a wire axis (a thickness direction of the wire), and the length of the measuring surface indicates the dimension of the measuring surface in a direction along the wire axis (a length direction of the wire). A further description will be provided with reference to FIG. 1. FIG. 1 is a schematic plan view illustrating a wire 1 in which the direction of the wire axis (the length direction of the wire) corresponds to the vertical direction (up-down direction) of FIG. 1 and the direction perpendicular to the wire axis (the thickness direction of the wire) corresponds to the horizontal direction (left-right direction) of FIG. 1. FIG. 1 shows a measuring surface 2 in relation to the wire 1. The width of the measuring surface 2 is represented by a dimension $w_a$ of the measuring surface in the direction perpendicular to the wire axis, and the length of measuring surface 2 is represented by a dimension 1 of the measuring surface in the direction of the wire axis.

In the present invention, a center of width of the wire in the direction perpendicular to the wire axis is positioned to be aligned with a center of width of the measuring surface, and the measuring surface is determined so that the width of the measuring surface is 5% or more and 15% or less of a diameter of the wire. The length of the measuring surface is set to be five times the width of the measuring surface. In FIG. 1, the width of the wire is indicated by a symbol W, and the center of the width of the wire is indicated by a one-dot broken line X. Thus, the measuring surface 2 is determined so that the center of width of the measuring surface 2 is positioned to be aligned with the one-dot broken line X indicating the center of width of the wire, and the width $w_a$ of the measuring surface is 5% or more and 15% or less of the diameter of the wire (the same value as the width W of the wire), that is, 0.05 W or more and 0.15 W or less. Further, the length $l_a$ of the measuring surface satisfies the relation of $l_a=5w_a$. By determining the position and dimensions of the measuring surface as described above, it is possible to accurately confirm presence of a region containing Ni as a main component or a region containing Au and Ni in the coating layer that is preferable to achieve a favorable FAB shape and achieve favorable bondability of the 2nd bonded part.

In the present invention, the fact that the coating layer has the region containing Ni as a main component on the core material side and the region containing Au and Ni on the wire surface side in the thickness direction of the coating layer is based on a measurement result under the conditions described in the section [Thickness analysis of coating layer by Auger electron spectroscopy (AES)] described later.

There will be described a tendency of the concentration profile in the depth direction obtained for the wire of the present invention according to an embodiment. The region containing Au and Ni is present from the surface of the wire to a certain depth position. In the region, the concentration of Au tends to be decreased and the concentration of Ni tends to be increased in the depth direction from the surface of the wire. Further proceeding in the depth direction, the concentration of Ni reaches a maximum value, and the concentration of Ni tends to be decreased and the concentration of Cu tends to be increased. Ni may show a maximum concentration at a certain depth position (d1), or may show a maximum value over a certain depth range (d1 to d2). In such a concentration profile, by focusing on increase and decrease of concentration of Au and Ni, it is possible to obtain presence of a region containing both Au and Ni and a region containing Ni as a main component, and positions of these regions. Additionally, in such a concentration profile, by focusing on increase and decrease of the concentration of Au or Ni, the maximum concentrations of Au and Ni can be obtained from the positions where the respective concentrations thereof become maximum. To obtain the maximum concentrations of Au and Ni in the coating layer, it is preferable to obtain the concentration profile for measuring surfaces at a plurality of points ($n \geq 3$) which are separated from each other by 1 mm or more in the direction of the wire axis, and employ an arithmetic average value thereof. A preferred range of the maximum concentration of Ni will be described later, but it can be said that the "region containing Ni as a main component" described above is present in a case where the maximum concentration of Ni is 50 mass % or more.

In a preferable embodiment, a position indicating the maximum concentration of Au is closer to the surface of the wire than a position indicating the maximum concentration of Ni in the concentration profile in the depth direction of the wire.

In combination with the conditions (2) to (4), from the viewpoint of achieving more favorable bond reliability, particularly the bond reliability of the 1st bonded part in a high-temperature environment, the maximum concentration of Ni may be preferably 80 atomic % or more, more preferably 85 atomic % or more, further preferably 90 atomic % or more, more than 90 atomic %, 92 atomic % or more, 94 atomic % or more, or 95 atomic % or more in the concentration profile in the depth direction of the wire. An upper limit of the maximum concentration of Ni in the coating layer is not particularly limited, and may be 100 mass %, for example.

—Condition (2)—

The condition (2) relates to the thickness of the coating layer.

By including the coating layer that satisfies the condition (2) in combination with the conditions (1), (3), and (4), the wire of the present invention can achieve a favorable FAB shape and favorable bond reliability of the 1st bonded part in a high-temperature environment.

Regarding the condition (2), from the viewpoint of achieving a favorable FAB shape and favorable bond reliability, the thickness of the coating layer (calculation method will be described later) is 10 nm or more, preferably 12 nm or more, more preferably 14 nm or more, further preferably 15 nm or more, further more preferably 16 nm or more, and particularly preferably 18 nm or more or 20 nm or more. Particularly, when the thickness of the coating layer is 18 nm or more, a favorable FAB shape may be achieved, a particularly favorable compression-bonding shape of the 1st bonded part may also be achieved, and bond reliability of the 1st bonded part can be improved more easily, which is preferable. Thus, in a preferable embodiment, the thickness of the coating layer is 18 nm or more. When the thickness of the coating layer is less than 10 nm, eccentricity tends to occur during the FAB formation, which deteriorates the FAB shape and the compression-bonding shape of the 1st bonded part. Furthermore, the upper limit of the thickness of the coating layer is, from the viewpoint of achieving a favorable FAB shape, 130 nm or less, preferably 125 nm or less, 120 nm or less, 115 nm or less, 110 nm or less, 105 nm or less, 100 nm or less, 95 nm or less, or 90 nm or less. When the thickness of the coating layer is more than 130 nm, irregular shape and melting failure tend to occur during the FAB formation, which tends to deteriorate the FAB shape and also the compression-bonding shape of the 1st bonded part.

The thickness of the coating layer in the condition (2) can be determined from the concentration profile in the depth direction described above. First, a boundary between the Cu core material and the coating layer is determined based on the concentration of Cu. The position at which the concentration of Cu is 50 atomic % is determined as the boundary, and then a region where the concentration of Cu is 50 atomic % or more is determined to be the Cu core material and a region where the concentration of Cu is less than 50 atomic % is determined to be the coating layer. In the present invention, the boundary between the Cu core material and the coating layer is not necessarily a crystal grain boundary. The thickness of the coating layer can then be determined, by confirming the concentration profile from the wire surface toward the center of the wire, as a distance from a wire surface position to a depth position where the concentration of Cu as the core material reaches 50 atomic % for the first time. In the present invention, for determining the thickness of the coating layer from the concentration profile in the depth direction, the unit of depth was in terms of $SiO_2$. Further, it is preferable to obtain the concentration profile for measuring surfaces at a plurality of points (n≥3) which are separated from each other by 1 mm or more in the direction of the wire axis, and employ an arithmetic average value thereof.

—Condition (3)—

The condition (3) relates to a range of the ratio $C_{Au}/C_{Ni}$ of the concentration $C_{Au}$ (mass %) of Au to the concentration $C_{Ni}$ (mass %) of Ni relative to the entire wire.

By including the coating layer that satisfies the condition (3) in combination with the conditions (1), (2), and (4), the wire of the present invention can achieve a favorable FAB shape and a favorable bondability of the 2nd bonded part while achieving favorable bond reliability in a high-temperature environment. Additionally, by including the coating layer satisfying the condition (3), capillary clogging can be suppressed at the time of continuous bonding, and productivity of the semiconductor device can be favorably maintained.

Regarding the condition (3), from the viewpoint of achieving a favorable bondability of the 2nd bonded part and suppressing capillary clogging at the time of continuous bonding, the ratio $C_{Au}/C_{Ni}$ is 0.02 or more, preferably 0.04 or more, more preferably 0.05 or more, 0.06 or more, 0.08 or more, or 0.1 or more. When the ratio $C_{Au}/C_{Ni}$ is less than 0.02, the bondability of the 2nd bonded part tends to be deteriorated, and occurrence frequency of capillary clogging at the time of continuous bonding also tends to be increased. From the viewpoint of achieving a favorable FAB shape and a favorable compression-bonding shape of the 1st bonded part, the upper limit of the ratio $C_{Au}/C_{Ni}$ is 0.7 or less, preferably 0.65 or less, more preferably 0.6 or less, 0.55 or less, 0.5 or less, 0.48 or less, 0.46 or less, or 0.45 or less. When the ratio $C_{Au}/C_{Ni}$ is more than 0.7, eccentricity tends to occur during the FAB formation, which deteriorates the FAB shape and the compression-bonding shape of the 1st bonded part.

The ratio $C_{Au}/C_{Ni}$ in the condition (3) can be calculated by dividing the concentration $C_{Au}$ (mass %) of Au relative to the entire wire measured by the method described in [Measurement of element content] described later by the concentration $C_{Ni}$ (mass %) of Ni that is similarly measured.

—Condition (4)—

The condition (4) relates to the concentration of Au at the surface of the wire.

By including the coating layer that satisfies the condition (4) in combination with the conditions (1) to (3), the wire of the present invention can achieve a favorable FAB shape and favorable bondability of the 2nd bonded part. Additionally, by including the coating layer satisfying the condition (4), capillary clogging can be suppressed at the time of continuous bonding, and productivity of the semiconductor device can be favorably maintained.

Regarding the condition (4), from the viewpoint of achieving a favorable bondability of the 2nd bonded part and suppressing capillary clogging at the time of continuous bonding, the concentration of Au at the surface of the wire of the present invention is 10 atomic % or more, preferably 15 atomic % or more, more preferably 20 atomic % or more, further preferably 25 atomic % or more, further more preferably 30 atomic % or more, 32 atomic % or more, 34 atomic % or more, 35 atomic, or more, 36 atomic % or more, 38 atomic % or more, or 40 atomic % or more. When the concentration of Au at the surface of the wire is less than 10 atomic %, the bondability of the 2nd bonded part tends to be deteriorated, and occurrence frequency of capillary clogging at the time of continuous bonding also tends to be increased. From the viewpoint of achieving a favorable FAB shape and a favorable compression-bonding shape of the 1st bonded part, the upper limit of the concentration of Au at the surface of the wire is 90 atomics or less, preferably 85 atomic % or less, more preferably 80 atomic % or less, 78 atomic % or less, 76 atomic % or less, 75 atomics or less, 74 atomic % or less, 72 atomic % or less, or 70 atomic % or less. When the concentration of Au at the surface of the wire is more than 90 atomic %, an eccentricity tends to occur during the FAB formation, which deteriorates the FAB shape and the compression-bonding shape of the 1st bonded part.

The concentration of Au at the wire surface in the condition (4) can be determined by performing the composition analysis of the wire surface as a measuring surface using an Auger electron spectroscopy (AES) method. Herein, when determining the concentration of Au at the surface, a gas component such as carbon (C), sulfur (S), oxygen (O) and nitrogen (N), a non-metal element, and the like are not considered.

The composition analysis of the wire surface can be performed under the same conditions as in 1) the composition analysis of the wire surface described in relation to the method of obtaining the concentration profile in the depth direction. Specifically, when performing the composition analysis of the wire surface using Auger electron spectroscopy (AES), the position and dimensions of the measuring surface are determined as follows.

The measuring surface is determined so that a center of width of the measuring surface is aligned with a center of width of the wire in the direction perpendicular to the wire axis, and the width of the measuring surface is 5% or more and 15% or less of a diameter of the wire. The length of the measuring surface is set to be five times the width of the measuring surface. By determining the position and dimensions of the measuring surface as described above, it is possible to measure the concentration of Au at the wire surface, which is preferable for improving the FAB shape and the bondability of the 2nd bonded part, with high accuracy. Further, it is preferable to perform the measurement for measuring surfaces at a plurality of points (n≥3) which are separated from each other by 1 mm or more in the direction of the wire axis, and employ an arithmetic average value thereof.

The concentration of Au at the wire surface in the condition (4) described above is based on a result of measurement under the conditions described in [Composition analysis of wire surface using Auger electron spectroscopy (AES)] described later.

The coating layer may contain one or more dopants selected from the first additive element, the second additive element and the third additive element described later, for example. Preferable contents of these dopants are described later.

The coating layer may also contain Pd as conductive metal other than Cu. For example, the coating layer may contain a certain amount of Pd so that a ratio $C_{Pd}/C_{Ni}$ of a concentration $C_{Pd}$ (mass %) of Pd to the concentration $C_{Ni}$ (mass %) of Ni relative to the entire wire is 0.8 or less, 0.6 or less, 0.5 or less, 0.4 or less, 0.3 or less, 0.2 or less, 0.12 or less, 0.11 or less, 0.1 or less, 0.08 or less, 0.06 or less, or 0.05 or less. In a case where the coating layer contains Pd, a lower limit of the ratio $C_{Pd}/C_{Ni}$ is not particularly limited, and may be 0.0001 or more, 0.0005 or more, or 0.001 or more, for example.

In an embodiment, the coating layer consists of Ni and Au; and inevitable impurities. In another embodiment, the coating layer consists of Ni and Au; at least one of In and Ag; and inevitable impurities. In still another embodiment, the coating layer consists of Ni and Au; one or more elements selected from Pd, the first additive element, the second additive element and the third additive element described later; and inevitable impurities. In still another embodiment, the coating layer consists of Ni and Au; at least one of In and Ag; one or more elements selected from Pd, the first additive element, the second additive element and the third additive element described later; and inevitable impurities. The term "inevitable impurities" used in relation to the coating layer encompasses elements constituting the Cu core material.

It is characterized that the wire of the present invention contains at least one of In and Ag. By including the coating layer that satisfies all of the conditions (1) to (4) and containing 1 ppm by mass or more of at least one of In and Ag relative to the entire wire, the wire of the present invention can achieve a favorable FAB shape and a favorable bondability of the 2nd bonded part, and further achieve favorable bond reliability of both of the 1st bonded part and the 2nd bonded part in a high-temperature environment.

Therefore, the wire of the present invention includes the coating layer that satisfies all of the conditions (1) to (4) described above, and satisfies at least one of the following conditions (i) and (ii):

(i) a concentration of In relative to the entire wire is 1 ppm by mass or more (ii) a concentration of Ag relative to the entire wire is 1 ppm by mass or more.

—Condition (i)—

The condition (i) relates to the concentration of In relative to the entire wire. Regarding the condition (i), from the viewpoint of improving the bond reliability in a high-temperature environment, particularly from the viewpoint of providing the bonding wire that achieves favorable bond reliability of 2nd bonded part in a rigorous high-temperature environment, irrespective of the wire diameter, the concentration of In relative to the entire wire is 1 ppm by mass or more, preferably 2 ppm by mass or more, 3 ppm by mass or more, 4 ppm by mass or more, or 5 ppm by mass or more, more preferably 6 ppm by mass or more, 8 ppm by mass or more, or 10 ppm by mass or more, further preferably 20 ppm by mass or more, 30 ppm by mass or more, or 40 ppm by mass or more, further more preferably 50 ppm by mass or more. Particularly, when the concentration of In relative to the entire wire is 50 ppm by mass or more, the bonding wire that achieves favorable bond reliability of the 2nd bonded part in a rigorous high-temperature environment, irrespective of the wire diameter, can be provided easily, which is preferable. The upper limit of the concentration of In relative to the entire wire may 100 ppm by mass or less, 95 ppm by mass or less, 90 ppm by mass or less and the like, for example, taking cost and other factors into the consideration. This is because even if the In content exceeds the upper limit, the effect of improving the bond reliability of the 2nd bonded part in a high-temperature environment reaches a plateau. Thus, in a embodiment, when the wire of the present invention satisfies the condition (i), the concentration of In relative to the entire wire is 1 ppm by mass or more and 100 ppm by mass or less.

—Condition (ii)—

The condition (ii) relates to the concentration of Ag relative to the entire wire. Regarding the condition (ii), from the viewpoint of improving the bond reliability in a high-temperature environment, particularly from the viewpoint of providing the bonding wire that achieves favorable bond reliability of 2nd bonded part in a rigorous high-temperature environment, irrespective of the wire diameter, the concentration of Ag relative to the entire wire is 1 ppm by mass or more, preferably 2 ppm by mass or more, 3 ppm by mass or more, 4 ppm by mass or more, or 5 ppm by mass or more, more preferably 10 ppm by mass or more, 20 ppm by mass or more, 30 ppm by mass or more, 40 ppm by mass or more, or 50 ppm by mass or more, further preferably 60 ppm by mass or more, or 80 ppm by mass, further more preferably 100 ppm by mass or more. Particularly, when the concentration of Ag relative to the entire wire is 100 ppm by mass or more, the bonding wire that achieves favorable bond reliability of the 2nd bonded part in a rigorous high-temperature environment, irrespective of the wire diameter, can be provided easily, which is preferable. The upper limit of the concentration of Ag relative to the entire wire may 500 ppm by mass or less, 480 ppm by mass or less, 460 ppm by mass or less, 450 ppm by mass or less and the like, for example, taking cost and other factors into the consideration. This is because even if the Ag content exceeds the upper limit, the effect of improving the bond reliability of the 2nd bonded part in a high-temperature environment reaches a plateau. Thus, in an embodiment, when the wire of the present invention satisfies the condition (ii), the concentration of Ag relative to the entire wire is 1 ppm by mass or more and 500 ppm by mass or less.

When neither the condition (i) nor (ii) is satisfied, that is, when the concentration of either In or Ag relative to the entire wire is less than 1 ppm by mass, the bond reliability of the 2nd bonded part tends to be lost in a rigorous high-temperature environment such as at a temperature of 200° C. Hereinabove, this tendency becomes more pronounced as the wire diameter of the bonding wire becomes larger.

Regarding the conditions (i) and (ii), preferable range of the concentration of In and Ag relative to the entire wire is described above. In a more preferable embodiment, the wire of the present invention satisfies at least one of the following conditions (i) and (ii):

(i) a concentration of In relative to the entire wire is 1 ppm by mass or more and 100 ppm by mass or less (ii) a concentration of Ag relative to the entire wire is 1 ppm by mass or more and 500 ppm by mass or less.

When at least one of the conditions (i) and (ii) is satisfied, from the viewpoint of further obtaining the effect of the present invention, a total concentration of In and Ag relative to the entire wire is 1 ppm by mass, preferably 2 ppm by mass or more, 3 ppm by mass or more, 4 ppm by mass or more, or 5 ppm by mass or more, more preferably 6 ppm by mass or more, 8 ppm by mass or more, or 10 ppm by mass or more, further preferably 20 ppm by mass or more, 30 ppm by mass or more, or 40 ppm by mass, further more preferably 50 ppm by mass or more, 60 ppm by mass or more, or 70 ppm by mass or more, and the upper limit is preferably 600 ppm by mass or less, more preferably 550 ppm by mass or less, further preferably 500 ppm by mass or less.

In the wire of the present invention, In and Ag may be contained in either one of the Cu core material and the coating layer, or may be contained in both of them. From the viewpoint of improving the bond reliability in a high-temperature environment, particularly from the viewpoint of providing the bonding wire that achieves favorable bond reliability of 2nd bonded part in a rigorous high-temperature environment, irrespective of the wire diameter, In and Ag are preferably contained in the Cu core material.

The wire of the present invention may further contain one or more elements selected from the group consisting of B, P and Mg ("first additive element"). When the wire of the present invention contains the first additive element, the total concentration of the first additive element is preferably 1 ppm by mass or more relative to the entire wire. This makes it possible to provide a bonding wire that achieve a more favorable compression-bonding shape of the 1st bonded part. The total concentration of the first additive element relative to the entire wire is more preferably 2 ppm by mass or more, and further preferably 3 ppm by mass or more, 5 ppm by mass or more, 8 ppm by mass or more, 10 ppm by mass or more, 15 ppm by mass or more, or 20 ppm by mass or more. From the viewpoint of suppressing hardening of the wire and reducing chip damage at the time of 1st bonding, the total concentration of the first additive element is preferably 100 ppm by mass or less, and more preferably 90 ppm by mass or less, 80 ppm by mass or less, 70 ppm by mass or less, 60 ppm by mass or less or 50 ppm by mass or less. Accordingly, in a preferable embodiment, the wire of the present invention contains the first additive element, and the total concentration of the first additive element is 1 ppm by mass or more and 100 ppm by mass or less relative to the entire wire.

When the wire of the present invention contains the first additive element, the first additive element may be contained in either one of the Cu core material and the coating layer, or may be contained in both of them. The first additive element is preferably contained in the Cu core material from the viewpoint of providing a bonding wire that achieves a further favorable compression-bonding shape of the 1st bonded part.

The wire of the present invention may further contain one or more elements selected from the group consisting of Se, Te, As and Sb ("second additive element"). When the wire of the present invention contains the second additive element, the total concentration of the second additive element is preferably 1 ppm by mass or more relative to the entire wire. This makes it possible to improve the bond reliability of the 1st bonded part in a high-temperature environment. The total concentration of the second additive element relative to the entire wire is more preferably 2 ppm by mass or more, and further preferably 3 ppm by mass or more, 5 ppm by mass or more, 8 ppm by mass or more, 10 ppm by mass or more, 15 ppm by mass or more, or 20 ppm by mass or more. From the viewpoint of achieving a favorable FAB shape and a favorable compression-bonding shape of the 1st bonded part, the total concentration of the second additive element is preferably 100 ppm by mass or less, and further preferably 90 ppm by mass or less, 80 ppm by mass or less, 70 ppm by mass or less, 60 ppm by mass or less, or 50 ppm by mass or less. Accordingly, in a preferable embodiment, the wire of the present invention contains the second additive element, and the total concentration of the second additive element is 1 ppm by mass or more and 100 ppm by mass or less relative to the entire wire.

When the wire of the present invention contains the second additive element, the second additive element may be contained in either one of the Cu core material and the coating layer, or may be contained in both of them. From the viewpoint of further improving the bond reliability of the 1st bonded part in a high-temperature environment, the second additive element is preferably contained in the coating layer. When the coating layer contains the second additive element, the second additive element may be contained in the region containing Au and Ni on the wire surface side, or may be contained in the region containing Ni as a main component on the core material side. When the coating layer contains Pd, the second additive element may be contained therein together with Pd.

The wire of the present invention may further contain one or more elements selected from the group consisting of Ga and Ge ("third additive element"). When the wire of the present invention contains the third additive element, the total concentration of the third additive element is preferably 0.011% by mass or more relative to the entire wire. This makes it possible to further improve the bond reliability of the 1st bonded part in a high-temperature environment. The total concentration of the third additive element relative to the entire wire is more preferably 0.015% by mass or more, and more preferably 0.02% by mass or more, 0.025% by mass or more, 0.03% by mass or more, 0.031% by mass or more, 0.035% by mass or more, 0.04% by mass or more, 0.05% by mass or more, 0.07% by mass or more, 0.09% by mass or more, 0.1% by mass or more, 0.12% by mass or more, 0.14% by mass or more, 0.15% by mass or more, or 0.2 by mass or more. From the viewpoint of achieving a favorable FAB shape, a favorable compression-bonding shape of the 1st bonded part, and a favorable 2nd bondability, the total concentration of the third additive element is preferably 1.5% by mass or less, and more preferably 1.4% by mass or less, 1.3% by mass or less or 1.2% by mass or less. Accordingly, in a preferable embodiment, the wire of the present invention contains the third additive element, and the total concentration of the third additive element is 0.011% by mass or more and 1.5% by mass or less relative to the entire wire.

When the wire of the present invention contains the third additive element, the third additive element may be contained in either one of the Cu core material and the coating layer, or may be contained in both of them.

The contents of In, Ag, the first additive element, the second additive element and the third additive element in the wire can be measured by the method described in [Measurement of element content] described later.

In the wire of the present invention, the total concentration of Cu, Ni, Au and Pd is, for example, 98.4% by mass or more, 98.5% by mass or more, 98.6% by mass or more or 98.7% by mass or more and the like.

—Other Preferable Conditions—

There will be described preferable conditions that the wire of the present invention further satisfies.

When forming the FAB by using the wire of the present invention and then measuring crystal orientations in a cross-section of the FAB perpendicular to a compression-bonding direction, it is preferable that a proportion of a crystal orientation <100> angled at 15° or less to the compression-bonding direction is 30% or more. This can achieve a particularly favorable compression-bonding shape of the 1st bonded part.

As described above, the bonding process with a bonding wire is carried out by performing 1st bonding of a wire part onto an electrode on the semiconductor chip; forming a loop; and finally performing 2nd bonding of a wire part onto the lead frame or an external electrode on the substrate. In the 1st bonding, a tip end of wire is heated and melted by arc heat input to form an FAB through surface tension, and then this FAB is compression-bonded (ball-bonded) onto the electrode on the semiconductor chip. The present inventors have found that a particularly favorable compression-bonding shape of the 1st bonded part can be achieved by a wire ensuring that, when forming an FAB by using the wire and then measuring crystal orientations in a cross-section of the FAB perpendicular to a compression-bonding direction, a proportion of a crystal orientation <100> angled at 150 or less to the compression-bonding direction (hereinafter also simply referred to as a "proportion of the crystal orientation <100> in the cross-section of the FAB") is 30% or more.

From the viewpoint of achieving a further favorable compression-bonding shape of the 1st bonded part, the proportion of the crystal orientation <100> in the cross-section of the FAB is more preferably 35% or more, further preferably 40% or more, further more preferably 45% or more, particularly preferably 50% or more, 55% or more, or 60% or more. In particular, the wire ensuring the proportion of the crystal orientation <100> in the cross-section of the FAB of 50% or more can achieve a particularly favorable compression-bonding shape of the 1st bonded part. Accordingly, in a preferable embodiment, the proportion of the crystal orientation <100> in the cross-section of the FAB is 30% or more, more preferably 50% or more. The upper limit of the proportion of the crystal orientation <100> in the cross-section of the FAB is not particularly limited and may be, for example, 100%, 99.5% or less, 99% or less, 98% or less, or the like.

Figure 2:
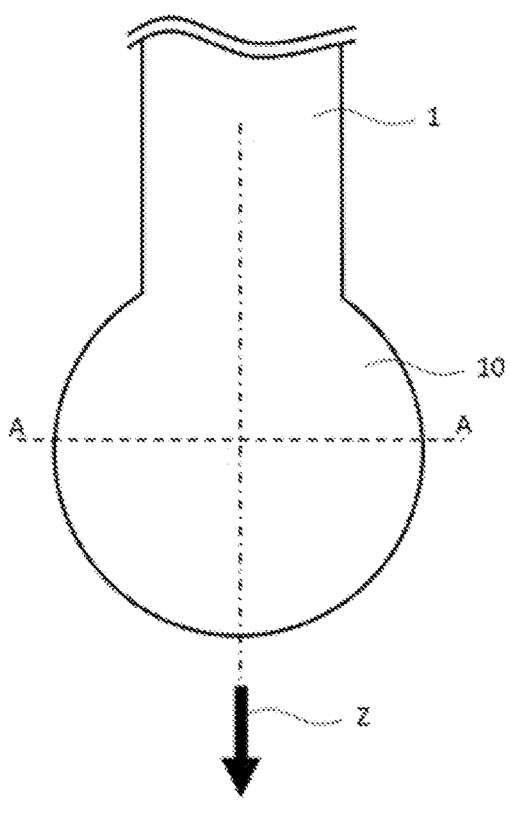
FIG. 2 is a schematic view illustrating a cross-section of FAB perpendicular to a compression-bonding direction.

There will be described the cross-section of the FAB perpendicular to the compression-bonding direction with reference to FIG. 2. FIG. 2 shows a schematic view where a tip end of the wire 1 is heated and melted by arc heat input to form an FAB 10 through surface tension. The FAB 10 thus formed is compression-bonded to an electrode (not shown) on a semiconductor chip. In FIG. 2, the compression-bonding direction of the FAB 10 is a direction indicated by an arrow Z (vertical direction (up-down direction) in FIG. 2). The cross-section perpendicular to the compression-bonding direction Z is a cross-section to be exposed by cutting the FAB along a dashed line A-A perpendicular to the direction Z. Herein, the dashed line A-A serving as a reference for the process of exposing a cross-section is set at a position where the diameter of the exposed cross-section becomes maximum, that is, a position where the diameter of the exposed cross-section becomes D when defining the diameter of the FAB as D. The straight line A-A may be deviated from the intended position in the process of exposing the cross-section, and the diameter of the exposed cross-section may be smaller than D. However, as long as the diameter of the exposed cross-section is 0.9 D or more, such a deviation is acceptable because the effect of the deviation on the proportion of the crystal orientation is negligibly small.

The crystal orientation in the cross-section of the FAB perpendicular to the compression-bonding direction can be measured using an Electron Backscattered Diffraction (EBSD) method. The measuring device used for the EBSD method includes a scanning electron microscope and a detector attached thereto. In the EBSD method, a diffraction pattern of reflected electrons generated by irradiating a sample with an electron beam is projected onto the detector, and the diffraction pattern is analyzed to determine the crystal orientation at each measurement point. For analyzing data obtained by the EBSD method, a dedicated software (OIM analysis manufactured by TSL Solutions, for example) can be used. The proportion of a specific crystal orientation can be calculated by inspecting the cross-section of the FAB perpendicular to the compression-bonding direction as an inspection surface, and using an analysis software dedicated to the measuring device.

In the present invention, the proportion of the crystal orientation <100> in the cross-section of the FAB is defined as a percentage of the area of the crystal orientation <100> relative to the measurement area. For calculating the proportion, only the crystal orientations that can be identified on the basis of a certain degree of reliability in the measuring surface are used. A portion where crystal orientation cannot be measured or a portion where the reliability of orientation analysis is low even when crystal orientation can be measured, and the like are excluded from the calculation of the measurement area and the area of the crystal orientation <100>. If the excluded data exceed, for example, 20% relative to the entire data, it is highly possible that there has been some kind of contamination in the measurement object. Thus, the measurement needs to be performed again from the process of exposing the cross-section. Further, in the present invention, the proportion of the crystal orientation <100> in the cross-section of the FAB is obtained as the arithmetic average value of the proportion values obtained by measuring three or more FABs.

The present inventors infer as follows about the reason why the wire having the proportion of the crystal orientation <100> in the cross-section of the FAB of 30% or more can achieve a particularly favorable compression-bonding shape of the 1st bonded part.

It is known that metal is deformed by slipping on a specific crystal plane or in a specific crystal direction (the plane and the direction are also called "slip plane" and "slip direction", respectively). The FAB formed using the wire of the present invention is mainly composed of Cu or Cu alloy serving as a core material, and its crystal structure is a face-centered cubic structure. In a case of having such a crystal structure, if the crystal orientation in the cross-section perpendicular to the compression-bonding direction is <100>, the metal slips in the direction of 45 degrees relative to the compression-bonding surface and deforms. As a result, the FAB deforms in the direction of 45 degrees relative to the compression-bonding surface and deforms while radially spreading relative to the plane parallel to the compression-bonding surface. As a result, it is inferred that the compression-bonding shape becomes closer to a true circle.

In the present invention, the proportion of the crystal orientation <100> in the cross-section of the FAB tends to fall within a desired range by adjusting the thickness of the coating layer, Ni concentration in the coating layer, and Cu purity of the core material. For example, the present inventors infer as follows about the reason why the thickness of the coating layer has the effect on the proportion of the crystal orientation <100> in the cross-section of the FAB. Specifically, it is considered that, during the melting stage, Ni in the coating layer is moderately diffusion-mixed toward the center of the FAB, and Cu or Cu alloy that contains the moderately diffusion-mixed Ni in a solid solution form is oriented in the crystal orientation <100> relative to the compression-bonding direction. Further, it is inferred that, when the thickness of the coating layer falls within the predetermined range, the diffusion-mixing of Ni during melting becomes moderate, thereby facilitating the alignment of the crystal orientation <100> relative to the compression-bonding direction. On the other hand, if the thickness of the coating layer is too thin, the crystal orientation tends to be random without orientation and if the thickness of the coating layer is too thick, other crystal orientations tend to be predominant.

The diameter of the wire of the present invention is not particularly limited and may be appropriately determined according to a specific purpose. Preferably, the diameter of the wire may be 30 μm or more, 35 μm or more, or 40 μm or more, for example. The upper limit of the diameter is not particularly limited and may be 80 μm or less, 70 μm or less, or 50 μm or less, for example.

<Manufacturing Method for Wire>

There will be described an example of a method for manufacturing the bonding wire for semiconductor devices according to the present invention.

First, raw material copper of high purity (4N to 6N; 99.99 to 99.9999% by mass or more) is processed into a large diameter (diameter of about 3 to 6 mm) by continuous casting to obtain an ingot.

The method of adding In, Ag, or a dopant such as the first additive element, the second additive element and the third additive element in case of adding, described above, examples of an addition method therefor may include a method of causing the dopant to be contained in the Cu core material, a method of causing the dopant to be contained in the coating layer, a method of depositing the dopant on the surface of the Cu core material, and a method of depositing the dopant on the surface of the coating layer. These methods may be combined with each other. The effect of the present invention can be achieved by employing any addition method. In the method of causing the dopant to be contained in the Cu core material, a copper alloy containing a required concentration of dopant may be used as a raw material to manufacture the Cu core material. In a case of obtaining such a copper alloy by adding the dopant to Cu as the raw material, a dopant component having high purity may be directly added to Cu, or alternatively, a mother alloy containing a dopant component at a concentration of about 1% may be used. In the method of causing the dopant to be contained in the coating layer, the dopant may be contained in Ni, Au, Pd plating bath at the time of forming the coating layer (in a case of wet plating), or in a target material (in a case of dry plating). In the method of depositing the dopant on the surface of the Cu core material and the method of depositing the dopant on the surface of the coating layer, at least one type of deposition treatment selected from (1) application of aqueous solution⇒drying⇒heat treatment, (2) a plating method (wet), and (3) a vapor deposition method (dry) may be performed while the surface of the Cu core material or the surface of the coating layer being as a deposition surface.

The ingot having a large diameter is subjected to forging, rolling, and wire-drawing to manufacture a wire with a diameter of about 0.7 to 2.0 mm (hereinafter also referred to as an "intermediate wire").

As a method for forming the coating layer on the surface of the Cu core material, an electroplating, an electroless plating, a vapor deposition, and the like can be used. Among them, the electroplating is preferable industrially because it can stably control film thickness. For example, the coating layer may be formed on the surface of the intermediate wire. The coating layer may be deposited at a stage of the ingot having large diameter, or the coating layer may be formed on the surface of the Cu core material after further thinning the intermediate wire by performing the wire-drawing (for example, after carrying out the wire-drawing to a final diameter of the Cu core material). In a case of forming the coating layer containing Pd, the coating layer may be formed by using an Ni plating liquid, a Pd plating liquid, or a plating liquid containing Ni and Pd at a predetermined ratio in accordance with a desired configuration of the coating layer. For example, after providing an Ni layer using an Ni plating liquid, the coating layer may be formed by providing a Pd layer or a Pd—Ni alloy layer using a Pd plating liquid or a plating liquid containing Ni and Pd at a predetermined ratio. From the viewpoint of forming the coating layer with an excellent adhesiveness to the Cu core material, a predetermined coating layer may be formed by performing strike plating with conductive metal on the surface of the Cu core material.

The region containing Au and Ni included in the coating layer on the wire surface side can be formed by providing an Au layer on the surface side of the coating layer by the same method as described above.

The wire-drawing process can be performed by using a continuous wire-drawing machine in which a plurality of diamond-coated dies can be set. If necessary, heat treatment may be performed during the wire-drawing process. Constituent elements are diffused to each other between the Au layer at the surface of the wire and the lower Ni layer (the Pd layer or the Pd—Ni alloy layer, if provided) by heat treatment, which makes it possible to form a region containing Au and Ni on the wire surface side of the coating layer. As a method therefor, a method that promotes alloying by continuously sweeping the wire at a constant speed in an electric furnace at a constant furnace temperature is preferable in that the Au concentration at the wire surface can be securely controlled to fall within a desired range. In substitution for the method of forming the region containing Au and Ni by additionally providing the Au layer on the coating layer and then performing the heat treatment, a method of depositing an alloy region originally containing Au and Ni may be employed.

The wire of the present invention can achieve a favorable FAB shape and a favorable bondability of the 2nd bonded part, and further achieves favorable bond reliability of both of the 1st bonded part and the 2nd bonded part in a high-temperature environment. Thus, the bonding wire of the present invention can be suitably used as bonding wires particularly for on-vehicle devices and power devices.

[Method for Manufacturing Semiconductor Device]

The semiconductor device can be manufactured by connecting the electrode on the semiconductor chip to the lead frame or the electrode on the circuit board by using the bonding wire for semiconductor devices of the present invention.

In an embodiment, the semiconductor device according to the present invention includes a circuit board, a semiconductor chip, and a bonding wire for electrically connecting the circuit board and the semiconductor chip with each other, and is characterized in that the bonding wire is the wire of the present invention.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP 2020-150116 A, the semiconductor device may include a lead frame and a semiconductor chip mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like.

Examples

There will be specifically described the present invention with Examples. However, the present invention is not limited to the Examples described below.

(Sample)

First, the method of preparing a sample will be described. For Cu as a raw material of the Cu core material, Cu having a purity of 99.99% by mass or more (4N) with the balance composed of inevitable impurities was used. In, Ag or, if added, the first additive element, the second additive element or the third additive element having a purity of 99% by mass or more with the balance composed of inevitable impurities was used, or alternatively a mother alloy of Cu with a high concentration of these additive elements was used.

For the Cu alloy as the core material, the raw material was first charged into a graphite crucible and melted by heating to 1090 to 1500° C. in an inert atmosphere such as an $N_2$ gas or Ar gas using a high-frequency furnace. Then, an ingot with a diameter of about 3 to 6 mm was obtained by continuous casting. Next, the ingot thus obtained was drawn to manufacture an intermediate wire with a diameter of about 0.7 to 2.0 mm, and then, wire-drawing processing and the like were continuously performed thereon using dies to further reduce the diameter of the wire to be coated. In the wire drawing process, a commercially available lubricant was used, and the wire-drawing speed was set to 20 to 150 m/min. For forming the coating layer, an acid washing with hydrochloric acid or sulfuric acid was performed to remove an oxide film on the wire surface, an Ni layer was formed to cover the entire surface of the Cu alloy as the core material, and an Au layer was provided on the surface thereof. In some examples, a Pd layer was provided after forming the Ni layer, and the Au layer was provided thereafter. An electroplating method was used for forming the Ni layer, the Au layer, and the Pd layer. As an Ni plating liquid, an Au plating liquid, and a Pd plating liquid, commercially available plating liquids were prepared and used after appropriately adjusted.

Thereafter, the wire was further subjected to wire-drawing processing and the like to be processed to have a final wire diameter of φ50 μm. During the wire-drawing processing, intermediate heat treatment was performed 1 to 2 times at 300 to 700° C. for 2 to 15 seconds as needed. The intermediate heat treatment was performed while continuously sweeping the wire under flowing of an $N_2$ gas or Ar gas. After the wire was processed to have the final wire diameter, a refining heat treatment was performed while continuously sweeping the wire under flowing of an $N_2$ gas or Ar gas. The heat treatment temperature for the refining heat treatment was 200 to 600° C., the wire feeding speed was 20 to 200 m/min, and the heat treatment time was 0.2 to 1.0 seconds. If the coating layer was thin or the Au concentration was low, the heat treatment temperature was set to be lower and the wire feeding speed was set to be higher. In the opposite case, the heat treatment temperature was set to be higher and the wire feeding speed was set to be lower.

(Test and Evaluation Methods)

There will be described test and evaluation methods.

[Composition Analysis of Wire Surface Using Auger Electron Spectroscopy (AES)]

The concentration of Au at the surface of the wire was determined by performing a measurement using the Auger electron spectroscopy (AES) where the measuring surface was a surface of the wire as follows.

First, the bonding wire to be measured was fixed to the sample holder in a linear arrangement. Next, the measuring surface was determined so that the center of width of the measuring surface was aligned with the center of width of the wire in the direction perpendicular to the wire axis, and the width of the measuring surface was 5% or more and 15% or less of the diameter of the wire. The length of the measuring surface was set to be five times the width of the measuring surface. With using an AES device (PHI-700 manufactured by ULVAC-PHI, INC.), the composition analysis was performed on the surface of the wire under a condition of acceleration voltage of 10 kV to obtain a surface Au concentration (atomic %).

The composition analysis using the AES was performed on the measuring surfaces at three points which were separated from each other by 1 mm or more in the direction of the wire axis, and an arithmetic average value thereof was employed. When determining the concentration of Au at the surface, a gas component such as carbon (C), sulfur (S), oxygen (O), or nitrogen (N), a nonmetallic element, and the like were not considered.

[Thickness Analysis of Coating Layer Using Auger Electron Spectroscopy (AES)]

A depth analysis using AES was used for the thickness analysis of the coating layer. The depth analysis using AES analyzes a change in a composition in the depth direction by alternately performing a composition analysis and sputtering, so that a change in concentration of each element in the direction from the surface of the wire toward the depth (center) of the wire (so-called a concentration profile in the depth direction) can be obtained.

Specifically, the concentration profile in the depth direction was obtained with AES by performing 1) a composition analysis of the wire surface, and then repeating 2) sputtering process with Ar and 3) a surface composition analysis after the sputtering treatment. The sputtering treatment in 2) was performed at an acceleration voltage of 2 kV with $Ar^+$ ion. In the surface composition analysis in 1) and 3), the dimensions of the measuring surface and the conditions for the composition analysis by the AES were the same as those described in [Composition analysis of wire surface using Auger electron spectroscopy (AES)] described above.

The concentration profile in the depth direction was obtained for the measuring surfaces at three points which were separated from each other by 1 mm or more in the direction of the wire axis.

—Thickness of Coating Layer—

In the obtained concentration profile in the depth direction, the concentration profile was confirmed from the wire surface toward the center of the wire, and a distance from the wire surface position to the depth position where the concentration of Cu as the core material reaches 50 atomic % for the first time was determined as a measured thickness of the coating layer. An arithmetic average value of numerical values obtained for the measuring surfaces at three points was employed as the thickness of the coating layer.

Note that the depth measured by the AES analysis is obtained as the product of the sputtering rate and time. Since the sputtering rate is generally measured using a reference sample $SiO_2$, the depth analyzed using AES is represented by an $SiO_2$ equivalent value. Thus, the unit for the thickness of the coating layer was in terms of $SiO_2$.

—Maximum Concentration of Ni and the Like in Coating Layer—

In the obtained concentration profile in the depth direction, by focusing on increase and decrease of the concentration of Ni, the maximum concentration thereof was obtained from the position where the concentration of Ni becomes maximum. The arithmetic average value of the numerical values obtained for the measuring surfaces at three points was employed as the maximum concentration of Ni.

Regarding the wire according to the example, it was confirmed that there was the region containing Ni as a main component on the core material side, there was the region containing Au and Ni on the wire surface side, the maximum concentration of Ni is 80 atomic % or more, and the position indicating the maximum concentration of Au was closer to the surface than the position indicating the maximum concentration of Ni. Regarding the wire according to the example in which the coating layer has a region containing Pd, it was confirmed that the position indicating the maximum concentration of Pd is closer to the surface than the position indicating the maximum concentration of Ni, and the position indicating the maximum concentration of Pd is present between the position indicating the maximum concentration of Au and the position indicating the maximum concentration of Ni.

[Measurement of Element Content]

The contents of Au, Ni, In, Ag, Pd, the first additive element, the second additive element, and the third additive element in the wire were detected as the concentration of elements contained in the entire wire by analyzing a liquid in which the bonding wire was dissolved with a strong acid using an ICP emission spectrometer or an ICP mass spectrometer. As an analysis device, ICP-OES ("PS3520UVDDII" manufactured by Hitachi High-Tech Corporation) or ICP-MS ("Agilent 7700x ICP-MS" manufactured by Agilent Technologies, Inc.) was used. The total concentration $C_M$ (mass %) of Ni, Au, and Pd was calculated by totaling concentrations of Ni, Au, and Pd.

[Fab Shape]

The evaluation of the FAB shape was performed by forming an FAB on a lead frame using a commercially available wire bonder and observing the FAB with a scanning electron microscope (SEM) (evaluation number N=100). The FAB was formed with a current value of 30 to 75 mA, an EFO gap of 762 μm, and a tail length of 500 μm while flowing an $N_2$+5% $H_2$ gas at a flow rate of 0.4 to 0.6 L/min. The diameter of the FAB was in the range of 1.5 to 1.9 times the wire diameter. The FAB shape was determined to be favorable if it had a true spherical shape and determined to be failure if it showed eccentricity, irregular shape, or poor melting. Evaluation was then performed in accordance with the following criteria.

Evaluation Criteria:

○: 5 or less failures

Δ: 6 to 10 failures (no problem for practical use)

X: 11 or more failures

[Measurement of Crystal Orientation in Cross-Section of FAB]

The FAB was formed using the commercially available wire bonder under the conditions described in the section [FAB shape] noted above, and the crystal orientation was measured where the measuring surface was a cross-section of the FAB perpendicular to the compression-bonding direction. In the present invention, the cross-section of the FAB perpendicular to the compression-bonding direction refers to a cross-section to be exposed by cutting the FAB along a dashed line A-A shown in FIG. 2, and the dashed line A-A serving as a reference was set at the position where the diameter of the exposed cross-section became maximum. The EBSD method was used for the measurement, and the proportion of the crystal orientation <100> was calculated according to the above-mentioned procedure by using the analysis software included in the apparatus. The proportion of the crystal orientation <100> in the cross-section of the FAB was determined by arithmetically averaging the values of the proportion obtained by measuring three FABs.

[Bondability of 2nd Bonded Part]

The bondability of the 2nd bonded part was evaluated by a 2nd bonding window test. 2nd bonding window test is a test for determining the number of conditions with which the bonding was possible among a total of 25 conditions for 2nd bonding. Specifically, the test is conducted under a total of 25 conditions that indicates 5 stages of ultrasonic current at the time of 2nd bonding from 140 mA to 180 mA in 10 mA increments in the horizontal axis, and 5 stages of load at the time of 2nd bonding from 80 gf to 120 gf in 10 gf increments in the vertical axis.

[Table 1]

TABLE 1

| | | Ultrasonic current (mA) | | | | |
|---|---|---|---|---|---|---|
| | | 140 | 150 | 160 | 170 | 180 |
| Load (gf) | 80 | | | | | |
| | 90 | | | | | |
| | 100 | | | | | |
| | 110 | | | | | |
| | 120 | | | | | |

This test was performed on each wire of Examples and Comparative Examples. Specifically, by using a commercially available wire bonder, 200 wires were bonded to leads of a lead frame for each condition. An Ag-plated lead frame was used as the lead frame, and bonding was performed at a stage temperature of 200° C. under a flow of an $N_2$+5% $H_2$ gas at a flow rate of 0.5 L/min. The number of conditions with which continuous bonding was able to be performed without causing problems such as non-bonding or stop of the bonder was determined, and evaluated in accordance with the following criteria.

Evaluation Criteria:

⊚: 24 conditions or more

○: 22 to 23 conditions

X: 21 conditions or less

[Bond Reliability of 1st Bonded Part]

The bond reliability of the 1st bonded part was evaluated by a High Temperature Storage Life Test (HTSL).

A sample was prepared by performing ball bonding, using a commercially available wire bonder, on an electrode that was disposed by depositing an Al—1.0 mass' Si—0.5 mass % Cu alloy having a thickness of 2.0 μm on a Si substrate on a general metal frame. The resultant sample was sealed by a commercially available thermosetting epoxy resin to manufacture a sample for testing the bond reliability of the 1st bonded part. The ball was formed under the conditions described in the section [FAB shape] noted above. The manufactured sample for bond reliability evaluation was exposed to an environment with a temperature of 200° C. using a high-temperature thermostatic device. The shear test on the ball bonded part was performed every 500 hours, and a time until a value of shear force became half of the initial shear force was determined to be the bonding life of the 1st bonded part. An arithmetic average value of measurement values of 50 ball bonded parts randomly selected was used for the value of the shear force. The shear test after the High Temperature Storage Life Test was performed after removing the resin by acid treatment, and exposing the ball bonded part. Evaluation was then performed in accordance with the following criteria.

Evaluation Criteria:

◎◎: Bonding life of 2500 hours or more

◎: Bonding life of 2000 hours or more and less than 2500 hours

○: Bonding life of 1000 hours or more and less than 2000 hours

X: Bonding life of less than 1000 hours

[Bond Reliability of 2nd Bonded Part]

The bond reliability of the 2nd bonded part was evaluated by a High Temperature Storage Life Test (HTSL)

A sample was prepared by performing wedge bonding onto leads of a lead frame using the commercially available wire bonder. The resultant sample was sealed by a commercially available thermosetting epoxy resin to manufacture a sample for testing the bond reliability of the 2nd bonded part. An Fe-42 atomic % Ni alloy lead frame plated with 1 to 3 μm Ni/Pd/Au was used for the lead frame. The manufactured sample for bond reliability evaluation was exposed to an environment with a temperature of 200° C. using a high-temperature thermostatic device. The pull test on the wedge bonded part was performed every 500 hours, and a time until a value of pull force became half of the initial pull force was determined to be the bonding life of the 2nd bonded part. An arithmetic average value of measurement values of 50 wedge bonded parts randomly selected was used for the value of the pull force. The pull test after the High Temperature Storage Life Test was performed after removing the resin by acid treatment, and exposing the wedge bonded part. Evaluation was then performed in accordance with the following criteria.

Evaluation Criteria:

◎: Bonding life of 2000 hours or more

○: Bonding life of 1000 hours or more and less than 2000 hours

X: Bonding life of less than 1000 hours

[Compression-Bonding Shape]

The evaluation of the compression-bonding shape of the 1st bonded part (the crushed shape of ball) was carried out by forming a ball using a commercially available wire bonder under the conditions described in the section [FAB shape] noted above, compression-bonding the ball onto an electrode that had been formed by depositing an Al—1.0 masse Si—0.5 mass % Cu alloy film having a thickness of 2.0 μm on a Si substrate, and observing the bonded part from directly above by an optical microscope (the number of evaluations N=100). In the evaluation of the crushed shape of ball, a case in which a crushed shape was close to true circle was determined to be favorable, and a case in which a crushed shape was an oval shape or a petal shape was determined to be failure. Evaluation was then performed in accordance with the following criteria.

Evaluation Criteria:

◎: 0 failure

○: 1 to 3 failures

Δ: 4 or 5 failures

X: 6 or more failures

[Capillary Life]

Continuous bonding was performed using a commercially available wire bonder, and the number of times of bonding until capillary clogging occurred and the bonding was disabled was counted. Evaluation was then performed in accordance with the following criteria.

Evaluation Criteria:

○: 1 million times or more

X: Less than 1 million times

[Chip Damage]

The evaluation of the chip damage was carried out by forming a ball using a commercially available wire bonder under the conditions described in the section [FAB shape] noted above, compression-bonding the ball onto an electrode that had been formed by depositing an Al—1.0 mass, Si—0.5 mass' Cu alloy film having a thickness of 2.0 μm on a Si substrate, dissolving the wire and the electrode with a chemical solution to expose the Si substrate, and observing the Si substrate directly below the bonded part by an optical microscope (the number of evaluations N=50). Evaluation was then performed in accordance with the following criteria.

Evaluation Criteria:

○: no crack or bonding traces

Δ: no crack, but there are sites where bonding traces were confirmed (3 sites or less)

X: all others

The evaluation results of Examples and Comparative Examples are shown in Tables 2, 3.

TABLE 2

| | No. | Diameter um | Thickness of coating layer nm | $C_{Au}/C_{Ni}$ | Concentration of Au at wire surface atomic % | Concentration of In in wire ppm by mass | Concentration of Ag in wire ppm by mass | $C_{Ni}/C_M$ *1 | Maximum concentration of Ni atomic % | First additive element (B, P, Mg) ppm by mass |
|---|---|---|---|---|---|---|---|---|---|---|
| Example | 1 | 50 | 85 | 0.12 | 35 | 50 | | 0.89 | 83 | |
| | 2 | 50 | 130 | 0.05 | 39 | 25 | | 0.95 | 82 | |
| | 3 | 50 | 42 | 0.16 | 18 | 100 | | 0.86 | 90 | |
| | 4 | 50 | 70 | 0.22 | 10 | 65 | | 0.82 | 95 | |
| | 5 | 50 | 122 | 0.02 | 55 | 18 | | 0.98 | 99 | |
| | 6 | 50 | 124 | 0.70 | 89 | 36 | | 0.59 | 80 | |
| | 7 | 50 | 10 | 0.09 | 34 | 22 | | 0.92 | 86 | |
| | 8 | 50 | 102 | 0.14 | 65 | 1 | | 0.88 | 87 | |
| | 9 | 50 | 18 | 0.12 | 90 | 42 | | 0.89 | 86 | |
| | 10 | 50 | 15 | 0.18 | 46 | 52 | | 0.84 | 95 | P: 53 |
| | 11 | 50 | 68 | 0.07 | 55 | 45 | | 0.94 | 94 | B: 1 |
| | 12 | 50 | 76 | 0.06 | 56 | 83 | | 0.94 | 86 | Mg: 100 |
| | 13 | 50 | 93 | 0.05 | 38 | 39 | | 0.95 | 84 | P: 25, B:25 |

TABLE 2-continued

| | | | | | | | | | | |
|---|---|---|---|---|---|---|---|---|---|---|
| | 14 | 50 | 73 | 0.13 | 46 | 47 | | 0.88 | 83 | |
| | 15 | 50 | 78 | 0.12 | 85 | 36 | | 0.89 | 88 | |
| | 16 | 50 | 83 | 0.11 | 77 | 49 | | 0.90 | 85 | |
| | 17 | 50 | 92 | 0.10 | 46 | 34 | | 0.91 | 90 | |
| | 18 | 50 | 104 | 0.09 | 38 | 47 | | 0.92 | 82 | |
| | 19 | 50 | 108 | 0.08 | 37 | 44 | | 0.92 | 86 | |
| | 20 | 50 | 120 | 0.08 | 26 | 63 | | 0.93 | 93 | |
| | 21 | 50 | 126 | 0.08 | 55 | 91 | | 0.57 | 91 | |
| | 22 | 50 | 86 | 0.11 | 68 | 63 | | 0.64 | 90 | |
| | 23 | 50 | 87 | 0.11 | 34 | 68 | | 0.50 | 92 | |
| | 24 | 50 | 78 | 0.16 | 68 | 77 | | 0.86 | 88 | B: 70 |
| | 25 | 50 | 102 | 0.12 | 88 | 35 | | 0.89 | 88 | Mg: 40 |
| | 26 | 50 | 85 | 0.14 | 38 | 51 | | 0.88 | 95 | P: 55 |
| | 27 | 50 | 10 | 0.54 | 44 | | 1 | 0.65 | 81 | |
| | 28 | 50 | 28 | 0.27 | 46 | | 50 | 0.79 | 83 | |
| | 29 | 50 | 53 | 0.14 | 83 | | 350 | 0.88 | 88 | |
| | 30 | 50 | 108 | 0.13 | 76 | | 500 | 0.88 | 98 | |
| | 31 | 50 | 130 | 0.14 | 12 | 50 | 100 | 0.88 | 91 | |
| | 32 | 50 | 84 | 0.08 | 65 | | 50 | 0.92 | 95 | P: 60 |
| | 33 | 50 | 101 | 0.17 | 89 | 25 | 50 | 0.86 | 81 | B: 25 |
| | 34 | 50 | 97 | 0.13 | 82 | 65 | | 0.50 | 86 | |
| | 35 | 50 | 80 | 0.07 | 35 | 64 | 42 | 0.90 | 90 | |
| Comparative example | 1 | 50 | 50 | 0 | 0 | 10 | | | | |
| | 2 | 50 | 83 | 0.01 | 13 | | | | | |
| | 3 | 50 | 38 | 0.85 | 8 | | 50 | | | |
| | 4 | 50 | 9 | 0.24 | 65 | | | | | |
| | 5 | 50 | 68 | 0.06 | 50 | | | | | |
| | 6 | 50 | 132 | 0.15 | 35 | 75 | | | | |
| | 7 | 50 | 100 | 0.09 | 92 | | | | | |

| | No. | Second additive element (Se, Te, As, Sb) ppm by mass | Third additive element (Ga, Ge) mass % | FAB shape | Bondability of 2nd bonded part | Bond reliability of 2nd bonded part | Bond reliability of 1st bonded part | Compression bonding shape | Capillary life | Chip damage |
|---|---|---|---|---|---|---|---|---|---|---|
| Example | 1 | | | ○ | ○ | ◎ | ◎ | ○ | ○ | ○ |
| | 2 | | | ○ | ○ | ○ | ◎ | ○ | ○ | ○ |
| | 3 | | | ○ | ○ | ◎ | ◎ | ○ | ○ | ○ |
| | 4 | | | ○ | ○ | ◎ | ◎ | ○ | ○ | ○ |
| | 5 | | | ○ | ○ | ○ | ◎ | ○ | ○ | ○ |
| | 6 | | | ○ | ◎ | ○ | ◎ | ○ | ○ | ○ |
| | 7 | | | ○ | ○ | ○ | ○ | ○ | ○ | ○ |
| | 8 | | | ○ | ○ | ○ | ◎ | ○ | ○ | ○ |
| | 9 | | | ○ | ◎ | ○ | ◎ | ○ | ○ | ○ |
| | 10 | | | ○ | ○ | ◎ | ○ | ◎ | ○ | ○ |
| | 11 | | | ○ | ○ | ○ | ◎ | ◎ | ○ | ○ |
| | 12 | | | ○ | ○ | ◎ | ◎ | ◎ | ○ | ○ |
| | 13 | | | ○ | ○ | ○ | ◎ | ◎ | ○ | ○ |
| | 14 | Se: 10 | | ○ | ○ | ○ | ◎ | ○ | ○ | ○ |
| | 15 | Te: 5 | | ○ | ◎ | ○ | ◎ | ○ | ○ | ○ |
| | 16 | As: 100 | | ○ | ◎ | ○ | ◎ | ○ | ○ | ○ |
| | 17 | Sb: 1 | | ○ | ○ | ○ | ◎ | ○ | ○ | ○ |
| | 18 | Se: 25, Te: 7 | | ○ | ○ | ○ | ◎ | ○ | ○ | ○ |
| | 19 | | Ga: 0.3 | ○ | ○ | ○ | ◎◎ | ○ | ○ | ○ |
| | 20 | | Ge: 0.011 | ○ | ○ | ◎ | ◎◎ | ○ | ○ | ○ |
| | 21 | | Ga: 1.5 | ○ | ○ | ◎ | ◎◎ | ○ | ○ | ○ |
| | 22 | | Ga: 0.2, Ge: 0.2 | ○ | ○ | ◎ | ◎◎ | ○ | ○ | ○ |
| | 23 | | | ○ | ○ | ◎ | ◎ | ○ | ○ | ○ |
| | 24 | As: 10 | | ○ | ○ | ◎ | ◎ | ◎ | ○ | ○ |
| | 25 | | Ge: 0.6 | ○ | ◎ | ○ | ◎◎ | ◎ | ○ | ○ |
| | 26 | Te: 8 | Ga: 0.4 | ○ | ○ | ◎ | ◎◎ | ◎ | ○ | ○ |
| | 27 | | | ○ | ◎ | ○ | ○ | ○ | ○ | ○ |
| | 28 | | | ○ | ◎ | ○ | ◎ | ○ | ○ | ○ |
| | 29 | | | ○ | ◎ | ◎ | ◎ | ○ | ○ | ○ |
| | 30 | | | ○ | ◎ | ◎ | ◎ | ○ | ○ | ○ |
| | 31 | | | ○ | ○ | ◎ | ◎ | ○ | ○ | ○ |
| | 32 | Te: 12 | | ○ | ○ | ○ | ◎ | ◎ | ○ | ○ |
| | 33 | Se: 30 | Ga: 0.5 | ○ | ◎ | ◎ | ◎◎ | ◎ | ○ | ○ |
| | 34 | Sb: 32 | Ge: 1.2 | ○ | ◎ | ◎ | ◎◎ | ○ | ○ | ○ |
| | 35 | Te: 15 | Ga: 0.7 | ○ | ○ | ◎ | ◎◎ | ○ | ○ | ○ |

TABLE 2-continued

| | | | | | | | | |
|---|---|---|---|---|---|---|---|---|
| Comparative example | 1 | ○ | X | ○ | ◎ | ○ | X | ○ |
| | 2 | ○ | X | X | ◎ | ○ | X | ○ |
| | 3 | ○ | X | ○ | ◎ | ○ | X | ○ |
| | 4 | X | ○ | X | X | X | ○ | ○ |
| | 5 | ○ | ○ | X | ◎ | ○ | ○ | ○ |
| | 6 | X | ○ | ◎ | ◎ | X | ○ | ○ |
| | 7 | ○ | ◎ | X | ◎ | ○ | ○ | ○ |

*1 Ratio of total concentration CM (mass %) of Ni, Au, and Pd to concentration CNi (mass %) of Ni relative to entire wire

TABLE 3

| | No. | Diameter um | Thickness of coating layer nm | $C_{Au}/C_{Ni}$ | Concentration of Au at wire surface atomic % | Concentration of In in wire ppm by mass | Concentration of Ag in wire ppm by mass | $C_{Ni}/C_M$ *1 | Maximum concentration of Ni atomic % |
|---|---|---|---|---|---|---|---|---|---|
| Example | 36 | 50 | 10 | 0.14 | 40 | 50 | | 0.88 | 88 |
| | 37 | 50 | 33 | 0.07 | 34 | 100 | | 0.94 | 90 |
| | 38 | 50 | 15 | 0.13 | 44 | 1 | | 0.89 | 91 |
| | 39 | 50 | 18 | 0.11 | 54 | 2 | | 0.90 | 93 |
| | 40 | 50 | 25 | 0.13 | 37 | 25 | | 0.88 | 87 |
| | 41 | 50 | 70 | 0.24 | 28 | 65 | | 0.81 | 84 |
| | 42 | 50 | 30 | 0.05 | 19 | 80 | | 0.95 | 80 |
| | 43 | 50 | 101 | 0.07 | 50 | | 1 | 0.94 | 85 |
| | 44 | 50 | 117 | 0.06 | 89 | | 300 | 0.94 | 82 |
| | 45 | 50 | 64 | 0.11 | 45 | 75 | 400 | 0.90 | 84 |

| | No. | First additive element (B, P, Mg) ppm by mass | Second additive element (Se, Te, As, Sb) ppm by mass | Third additive element (Ga, Ge) mass % | Crystal orientation <100> in FAB cross-section % | Refining heat treatment temperature ° C. | FAB shape | Compression bonding shape |
|---|---|---|---|---|---|---|---|---|
| Example | 36 | | | | 62 | 480 | ○ | ◎ |
| | 37 | | | | 55 | 530 | ○ | ◎ |
| | 38 | | | | 42 | 490 | ○ | ○ |
| | 39 | | | | 58 | 500 | ○ | ◎ |
| | 40 | | | | 40 | 520 | ○ | ○ |
| | 41 | | | | 37 | 570 | ○ | ○ |
| | 42 | | | | 25 | 620 | ○ | Δ |
| | 43 | | | | 35 | 600 | ○ | ○ |
| | 44 | | | | 65 | 550 | ○ | ◎ |
| | 45 | | | | 40 | 530 | ○ | ○ |

*1 Ratio of total concentration CM (mass %) of Ni, Au, and Pd to concentration CNi (mass %) of Ni relative to entire wire All of the wires of Example Nos. 1 to 35 included the coating layer that satisfied all of the conditions (1) to (4) specified in this specification, and contains 1 ppm by mass or more of at least one of In and Ag relative to the entire wire, and it was confirmed that they achieved a favorable FAB shape and favorable bondability of the 2nd bonded part, and further achieved favorable bond reliability of both of the 1st bonded part and 2nd bonded part in a high-temperature environment with a temperature of 200° C. Particularly, the wires of Example Nos. 1, 3, 4, 10, 12, 20 to 24, 26, 29 to 31, and 33 to 35 included the coating layer that satisfied all of the conditions (1) to (4) specified in this specification, in which the contents of In and Ag relative to the entire wire are in the preferable range thereof, and it was confirmed that they achieved an especially excellent bond reliability of the 2nd bonded part in a high-temperature environment with a temperature of 200° C. even when the wire diameter was relatively large such as 50 µm.

Additionally, it was confirmed that the wires of Example Nos. 10 to 13, 24 to 26, 32, and 33 containing the first additive element of 1 ppm by mass or more in total achieved an especially excellent compression-bonding shape of the 1st bonded part. It was confirmed that the wires of Example Nos. 14 to 18, 24, 26, and 32 to 35 containing the second additive element of 1 ppm by mass or more in total achieved an especially excellent bond reliability of the 1st bonded part in a high-temperature environment. It was confirmed that the wires of Example Nos. 19 to 22, 25, 26, and 33 to 35 containing the third additive element of 0.011% by mass or more in total achieved an especially excellent bond reliability of the 1st bonded part in a high-temperature environment.

On the other hand, the wires of Comparative Example Nos. 1 to 7 included the coating layer that did not satisfy at least one of the conditions (1) to (4) specified in this specification or a concentration of In or Ag relative to the entire wire was 1 ppm by mass or less, and it was confirmed that at least one of the FAB shape, the bondability of the 2nd bonded part, and at least one of the bond reliability of the 1st bonded part and the bond reliability of the 2nd bonded part was poor.

It was confirmed that a favorable compression-bonding shape of the 1st bonded part was achieved by a wire ensuring that, when forming an FAB by using the wire and then measuring crystal orientations in a cross-section of the FAB perpendicular to a compression-bonding direction, a proportion of a crystal orientation <100> angled at 15° or less to the compression-bonding direction was 30% or more (Example Nos. 36 to 45). In particular, it was confirmed that the wire ensuring the proportion of the crystal orientation <100> of 50% or more was capable of achieving an especially excellent compression-bonding shape of the 1st bonded part (Example Nos. 36, 37, 39, and 44).

REFERENCE SIGNS LIST

1 bonding wire (wire)
2 measuring surface
X center of width of a wire
W width of a wire
$w_a$ width of a measuring surface
$l_a$ length of a measuring surface
10 FAB
Z compression-bonding direction

The invention claimed is:

1. A bonding wire for semiconductor devices, the bonding wire comprising:
- a core material of Cu or Cu alloy; and
- a coating layer containing conductive metal other than Cu formed on a surface of the core material, wherein
- the coating layer has a region containing Ni as a main component on a core material side, and has a region containing Au and Ni on a wire surface side, in a thickness direction of the coating layer,
- a thickness of the coating layer is 10 nm or more and 130 nm or less,
- a ratio $C_{Au}/C_{Ni}$ of a concentration $C_{Au}$ (mass %) of Au to a concentration $C_{Ni}$ (mass %) of Ni relative to the entire wire is 0.02 or more and 0.7 or less,
- a concentration of Au at the surface of the wire is 10 atomic % or more and 90 atomic % or less, and
- at least one of the following conditions (i) and (ii) is satisfied:
- (i) a concentration of In relative to the entire wire is 1 ppm by mass or more and 100 ppm by mass or less
- (ii) a concentration of Ag relative to the entire wire is 1 ppm by mass or more and 500 ppm by mass or less.

2. The bonding wire according to claim 1, wherein the concentration of Au at the surface of the wire is measured using Auger electron spectroscopy (AES) under the following <Condition>:
- <Condition> a center of width of a measuring surface is aligned with a center of width of the wire, the width of the measuring surface is 5% or more and 15% or less of a diameter of the wire, and a length of the measuring surface is five times the width of the measuring surface.

3. The bonding wire according to claim 1, wherein the coating layer further contains Pd as conductive metal other than Cu.

4. The bonding wire according to claim 1, wherein a ratio $C_{Ni}/C_M$ of a concentration $C_{Ni}$ (mass %) of Ni to a total concentration $C_M$ (mass %) of Ni, Au, and Pd relative to the entire wire is 0.5 or more.

5. The bonding wire according to claim 1, wherein a maximum concentration of Ni is 80 atomic % or more in a concentration profile in a depth direction of the wire.

6. The bonding wire according to claim 5, wherein the concentration profile in the depth direction of the wire is obtained by performing the measurement using Auger electron spectroscopy (AES) under the following <Condition> while digging down the wire from its surface in the depth direction by Ar sputtering:
- <Condition> a center of width of a measuring surface is aligned with a center of width of the wire, the width of the measuring surface is 5% or more and 15% or less of a diameter of the wire, and a length of the measuring surface is five times the width of the measuring surface.

7. The bonding wire according to claim 1, wherein when forming a free air ball (FAB: Free Air Ball) by using the wire and then measuring crystal orientations in a cross-section of the FAB perpendicular to a compression-bonding direction, a proportion of a crystal orientation <100> angled at 15° or less to the compression-bonding direction is 30% or more.

8. The bonding wire according to claim 7, wherein the proportion of the crystal orientation <100> angled at 15° or less to the compression-bonding direction is 50% or more.

9. The bonding wire according to claim 1, wherein the thickness of the coating layer is 18 nm or more.

10. The bonding wire according to claim 1, wherein
- the bonding wire contains one or more elements selected from the group consisting of B, P and Mg (hereinafter referred to as a "first additive element"), and
- a total concentration of the first additive element is 1 ppm by mass or more and 100 ppm by mass or less relative to the entire wire.

11. The bonding wire according to claim 1, wherein
- the bonding wire contains one or more elements selected from the group consisting of Se, Te, As and Sb (hereinafter referred to as a "second additive element"), and
- a total concentration of the second additive element is 1 ppm by mass or more and 100 ppm by mass or less relative to the entire wire.

12. The bonding wire according to claim 1, wherein
- the bonding wire contains one or more elements selected from the group consisting of Ga and Ge (hereinafter referred to as a "third additive element"), and
- a total concentration of the third additive element is 0.011% by mass or more and 1.5% by mass or less relative to the entire wire.

13. A semiconductor device comprising the bonding wire according to claim 1.

* * * * *